United States Patent [19]

Ohtani et al.

[11] Patent Number: 5,308,210
[45] Date of Patent: May 3, 1994

[54] INTERFACE APPARATUS FOR TRANSPORTING SUBSTRATES BETWEEN SUBSTRATE PROCESSING APPARATUS

[75] Inventors: Masami Ohtani; Yoshiji Oka; Takeo Okamoto; Yoshiteru Fukutomi, all of Kyoto, Japan

[73] Assignee: Dainippon Screen Mfg. Co., Ltd., Kyoto, Japan

[21] Appl. No.: 80,652

[22] Filed: Jun. 22, 1993

Related U.S. Application Data

[63] Continuation of Ser. No. 729,959, Jul. 15, 1991, abandoned.

[30] Foreign Application Priority Data

Jul. 23, 1990 [JP] Japan ................................ 2-78099[U]
Jul. 24, 1990 [JP] Japan ................................ 2-195129

[51] Int. Cl.⁵ ............................................... B65G 49/07
[52] U.S. Cl. ................................... 414/222; 414/331; 414/416; 414/744.3; 414/937
[58] Field of Search ............... 414/217, 222, 331, 416, 414/403, 744.3, 744.8, 752, DIG. 3, 277

[56] References Cited

U.S. PATENT DOCUMENTS

| | | | |
|---|---|---|---|
| 4,178,113 | 11/1979 | Beaver, II et al. | 414/DIG. 3 X |
| 4,500,407 | 2/1985 | Boys et al. | 414/416 X |
| 4,584,045 | 4/1986 | Richards | 414/222 X |
| 4,619,573 | 10/1986 | Rathmann et al. | 414/222 |
| 4,695,215 | 9/1987 | Jacoby et al. | 414/225 |
| 4,713,551 | 12/1987 | Layman et al. | 250/223 R X |
| 4,775,281 | 10/1988 | Prentakis | 414/416 |
| 4,813,846 | 3/1989 | Helms | 414/744.1 |
| 4,917,556 | 4/1990 | Stark et al. | 414/222 X |
| 4,938,654 | 7/1990 | Schram | 414/225 X |
| 4,951,601 | 8/1990 | Maydan et al. | 414/217 X |
| 4,969,790 | 11/1990 | Petz et al. | 414/331 X |
| 4,990,047 | 2/1991 | Wagner et al. | 414/217 |
| 5,030,056 | 7/1991 | Kitayama et al. | 414/222 X |
| 5,037,262 | 8/1991 | Moll et al. | 414/222 |
| 5,058,526 | 10/1991 | Matsushita et al. | 414/217 X |
| 5,061,144 | 10/1991 | Akimoto et al. | 414/225 |
| 5,067,218 | 11/1991 | Williams | 414/DIG. 3 X |
| 5,076,205 | 12/1991 | Vowles et al. | 414/217 X |

FOREIGN PATENT DOCUMENTS

0278516 A2  8/1988  European Pat. Off.
0350752 A2  1/1990  European Pat. Off.
2198881 A   6/1988  United Kingdom.

Primary Examiner—Michael S. Huppert
Assistant Examiner—James Keenan
Attorney, Agent, or Firm—Lowe, Price, LeBlanc & Becker

[57] ABSTRACT

An interface apparatus for transferring substrates between processing apparatus which provide various treatments for the substrates. The interface apparatus includes a transfer mechanism which, during a normal operation, receives substrates from an upstream processing apparatus and delivers the substrates to a downstream processing apparatus. Upon occurrence of a trouble in the downstream processing apparatus, the substrates transported from the upstream processing apparatus to the transfer mechanism are deposited in a substrate storage by a depositing and fetching mechanism. After the trouble is eliminated, the transfer mechanism delivers the substrates taken out of the storage to the downstream processing apparatus.

7 Claims, 7 Drawing Sheets

INTERFACE APPARATUS FOR TRANSPORTING SUBSTRATES BETWEEN SUBSTRATE PROCESSING APPARATUS

This application is a continuation of application Ser. No. 07/729,959 filed Jul. 15, 1991, now abandoned.

BACKGROUND OF THE INVENTION (1) Field of the Invention

The present invention relates to an interface apparatus for transporting substrates between substrate processing apparatus that successively carry out processing, including photoresist application, exposure, development and etching, of various types of substrates such as semiconductor wafers and glass substrates for liquid crystal displays.

(2) Description of the Related Art

Several types of processing apparatus are arranged serially to form a required processing line. These apparatus include an application processing apparatus for applying photoresist to the substrates, an exposure apparatus for exposing the substrates with the photoresist applied thereto, and a developing apparatus for developing the exposed substrates.

Each of these processing apparatus includes a single processing unit or a plurality of processing units. The application processing unit, for example, includes a contact promoting unit for causing vapor of a resist contact promoting agent to contact substrate surfaces, a rotary coating unit, a heating unit, and a cooling unit for reducing substrate temperature to room temperature. Each processing apparatus also includes a substrate transport mechanism having a movable arm for carrying the substrates, with the various processing units arranged around the transport mechanism.

The substrates are transported from one processing apparatus to another by an interface apparatus disposed therebetween. In this transportation, the substrates are once transferred from the substrate transport mechanism of one processing apparatus to the interface apparatus. Subsequently, the substrate transport mechanism of the next processing apparatus receives the substrates from the interface apparatus.

The known system as constructed above has the following disadvantage.

When the processing apparatus that receives the substrates (hereinafter referred to as a downstream apparatus) becomes inoperable owing to some trouble, the interface apparatus cannot dispose of the substrates. Consequently, the processing apparatus that gives the substrates (hereinafter referred to as an upstream apparatus) must also stop operating. All the processing must be suspended until the trouble is eliminated, which results in a low operating efficiency of the processing apparatus.

SUMMARY OF THE INVENTION

The present invention has been made having regard to the state of the art noted above, and has for an object to provide an interface apparatus disposed between two processing apparatus, which interface apparatus, when a trouble occurs with one of the processing apparatus, does not require the other processing apparatus to stop operating.

Another object of the present invention is to provide an interface apparatus disposed between two processing apparatus, which interface apparatus, when a trouble occurs with one of the processing apparatus, requires only a minimal waiting time for the other processing apparatus.

The above objects are fulfilled, according to the present invention, by an interface apparatus for transferring substrates between a first processing apparatus having a first substrate transport device for successively transporting the substrates into and out of a plurality of processing units, and a second processing apparatus having a second substrate transport device for transporting the substrates into and out of one or a plurality of processing units, the interface apparatus comprising:

(a) a transfer device for transferring the substrates between the first substrate transport device and second substrate transport device;

(b) a storage device for storing a plurality of substrates; and (c) a depositing and fetching device for transporting the substrates between the transfer device and storage device.

According to the present invention, when a trouble occurs with a downstream processing apparatus so that its operation must be discontinued, a substrate output from an upstream processing apparatus is once delivered to the transfer device of the interface apparatus. Then the depositing and fetching device picks up the substrate from the transfer device and deposits it in the storage device. Subsequent substrates output from the upstream processing apparatus are also stored in the storage device.

When the trouble is eliminated from the downstream processing apparatus, the depositing and fetching device fetches the substrates stored in the storage device, and delivers them to the transfer device. After the transfer device delivers the substrates to the downstream processing apparatus, a normal operation is reinstated in which substrates are transferred from the upstream processing apparatus to the downstream processing apparatus.

Thus, even when a trouble prohibits the downstream processing apparatus from accepting substrates, the upstream processing apparatus is allowed to continue its operation with the substrates from the upstream processing apparatus stored in the storage device of the interface apparatus. Consequently, the substrates are treated continuously without lowering operating efficiency of the processing apparatus.

According to the present invention, when a trouble occurs with the downstream processing apparatus, the substrate supported by the transfer device of the interface apparatus must be deposited in the storage device so that the interface apparatus is ready to receive a substrate from the upstream processing apparatus. Normally, an operation to store a substrate in the storage device is time-consuming. If a trouble occurs with the downstream processing apparatus when a substrate is handled by the transfer device of the interface apparatus in the course of transfer from the upstream processing apparatus to the downstream processing apparatus, the interface apparatus cannot receive a next substrate from the upstream processing apparatus before the substrate handled by the transfer device is deposited in the storage device. This may cause the inconvenience of forcing the upstream processing apparatus to wait for a long time.

In order to minimize the waiting time of the upstream processing apparatus, it is preferable that the interface apparatus includes vertically movable temporary support arms for receiving a substrate from the transfer device and retaining the substrate in a position above the transfer device.

According to the interface apparatus including such temporary support arms, when a trouble prohibits the downstream processing apparatus from accepting substrates, the temporary support arm picks up a first substrate transported from the upstream processing apparatus to the interface apparatus, and retains this substrate above the transfer device.

When the trouble is eliminated from the downstream processing apparatus, the substrate retained by the temporary support arms is delivered to the downstream processing apparatus first. Thereafter, the depositing and fetching device fetches the substrate stored in the storage device, and delivers them to the transfer device. After the transfer device delivers these substrates to the downstream processing apparatus, a normal operation is reinstated in which new substrates are transferred from the upstream processing apparatus to the downstream processing apparatus.

Thus, according to the interface apparatus including the temporary support arms, the temporary support arms are operable to pick up the substrate supported on the transfer device and move to an upward standby position promptly upon occurrence of a trouble with the downstream processing apparatus. Subsequent substrates are transferred to the interface apparatus only in the cycles in which the upstream processing apparatus processes the substrates. The interface apparatus receives the substrates with sufficient intervals of time for depositing the substrates in the storage device. Consequently, a trouble occurring with the downstream processing apparatus does not lead to the upstream processing apparatus being suspended from operation for an unduly long time.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DESCRIPTION OF THE PREFERRED EMBODIMENTS

A preferred embodiment of the present invention will be described in detail hereinafter with reference to the drawings.

Figure 1:
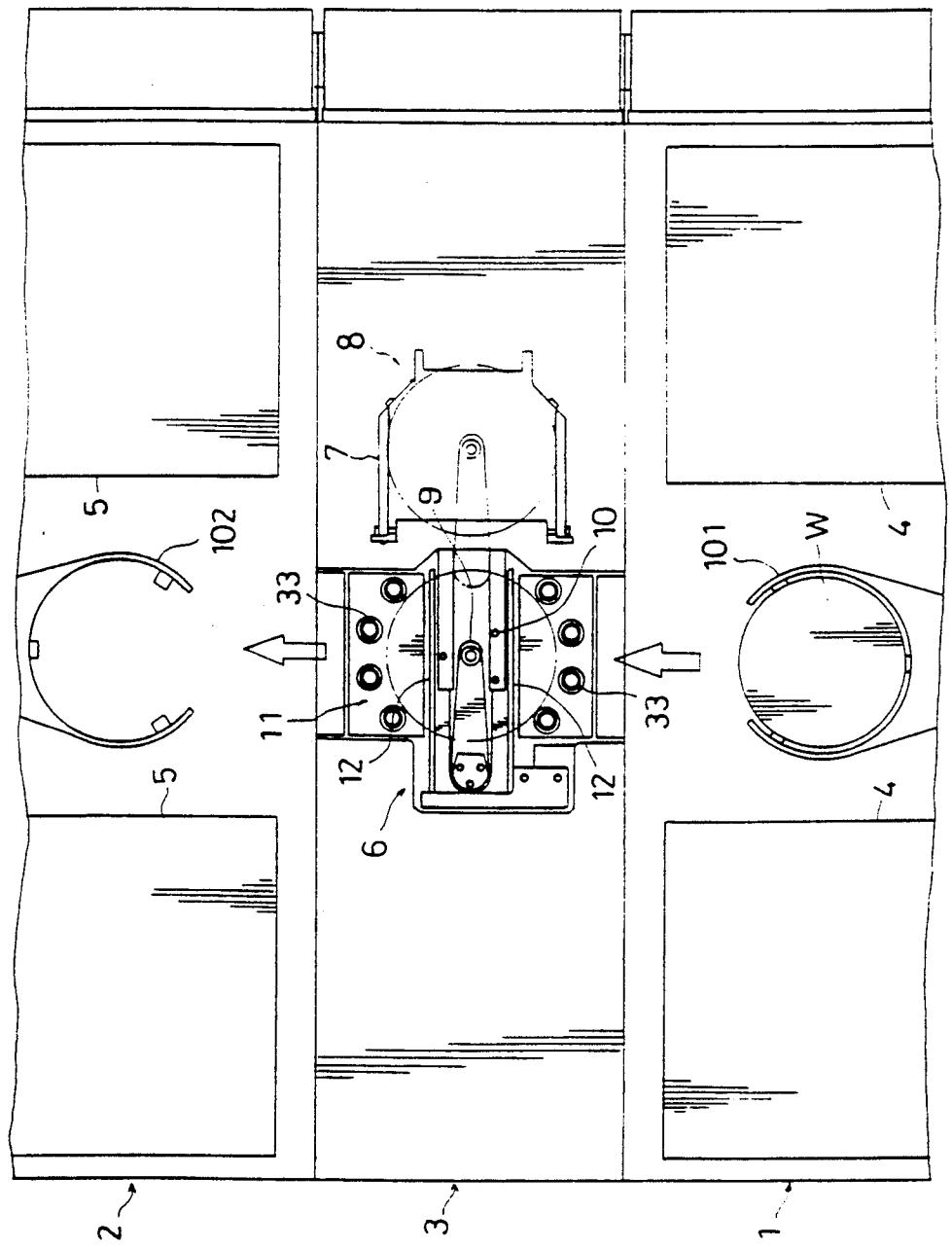
FIG. 1 is a plan view of a principal portion of an interface apparatus in one embodiment of the present invention.

FIG. 1 shows a plan of a principal portion of an interface apparatus. In the drawing, reference numeral 1 denotes an upstream processing apparatus, reference numeral 2 a downstream processing apparatus, and reference numeral 3 the interface apparatus disposed between the two processing apparatus 1 and 2 for transferring substrates or wafers W.

The upstream processing apparatus 1 carries out a plurality of processes on the wafers W transported by a wafer transport mechanism 101 successively into and out of a plurality of processing units 4. Similarly, the downstream processing apparatus 2 includes a wafer transport mechanism 102 and a plurality of processing units 5 for processing the wafers W as transported.

The wafer transport mechanisms 101 and 102 of the two processing apparatus 1 and 2 must have wafer-carrying portions devised to least contaminate back faces of the wafers W since the wafers W are incessantly transported within the processing apparatus. For this purpose, the wafer-carrying portion of each transport mechanism 101 or 102 includes an arc-shaped member surrounding a large part of the circumference of a wafer W, and supporter pieces extending therefrom toward the center of the wafer W to support the wafer W in a state akin to point contact with the back face thereof.

Figure 2:
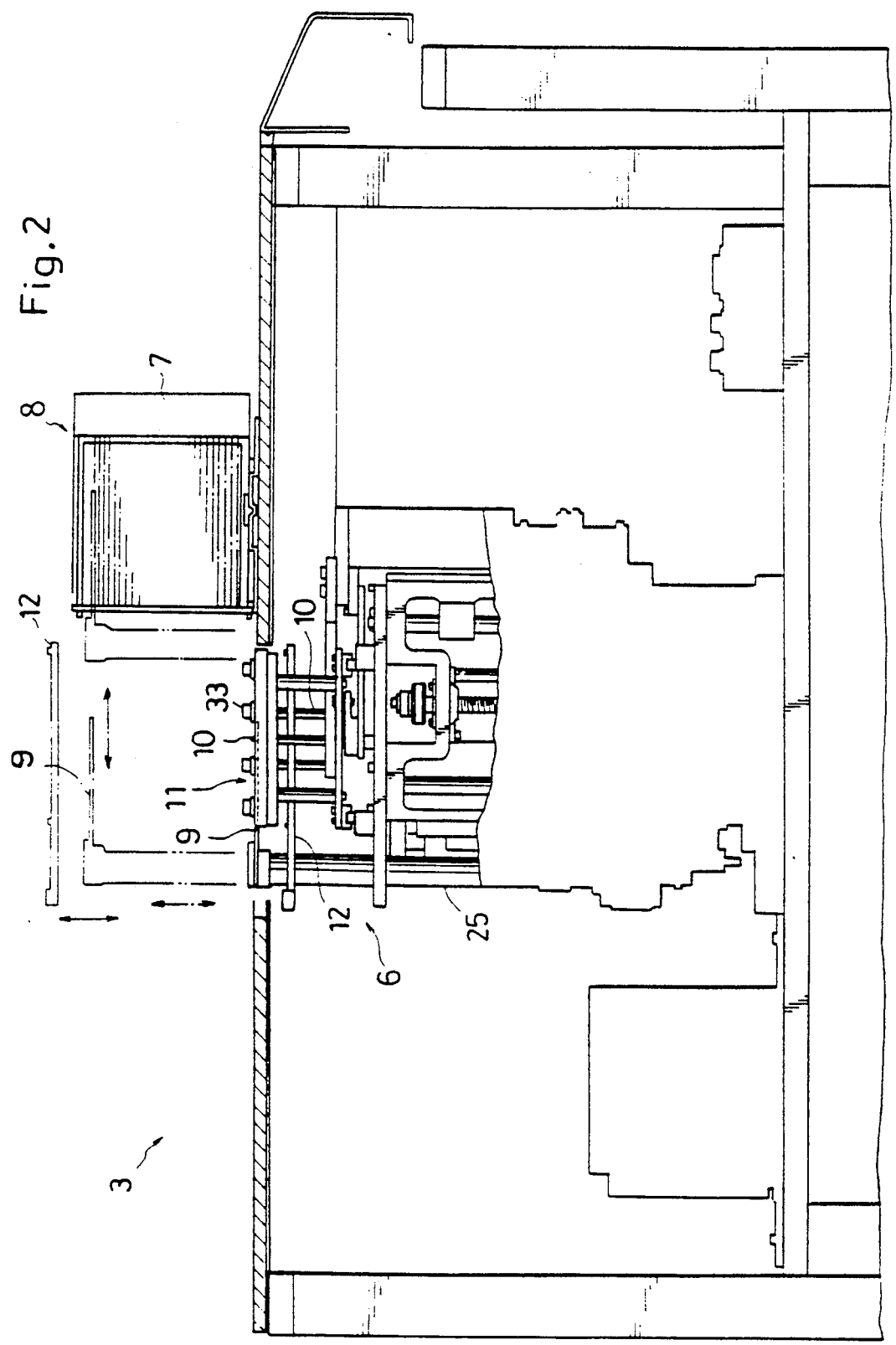
FIG. 2 is a side view of the interface apparatus.

As shown in FIGS. 1 and 2, the interface apparatus 3 includes a wafer transfer mechanism 6 opposed to a wafer outlet of the upstream processing apparatus 1 and a wafer inlet of the downstream processing apparatus 2. The interface apparatus 3 further includes a cassette 7 disposed laterally of the transfer mechanism 6 to serve as a wafer storage 8 for storing the wafers W in multiple stages, and an arm 9 for depositing and fetching wafers.

FIGS. 3 through 6 show details of the wafer transfer mechanism 6.

The wafer transfer mechanism 6 includes the arm 9 which is vertically and transversely movable for holding a wafer W by suction applied centrally of a back face of the wafer W, three supporting pins 10 vertically movable for supporting the wafer W, a wafer adjusting mechanism 11 for adjusting position of the wafer W supported on the supporting pins 10, temporary support arms 12 vertically movable while supporting the wafer W after the positional adjustment, and drive mechanisms for driving the wafer adjusting mechanism 11 and temporary support arms 12. The construction and operation of each of these components will be described in detail hereinafter.

Figure 4:
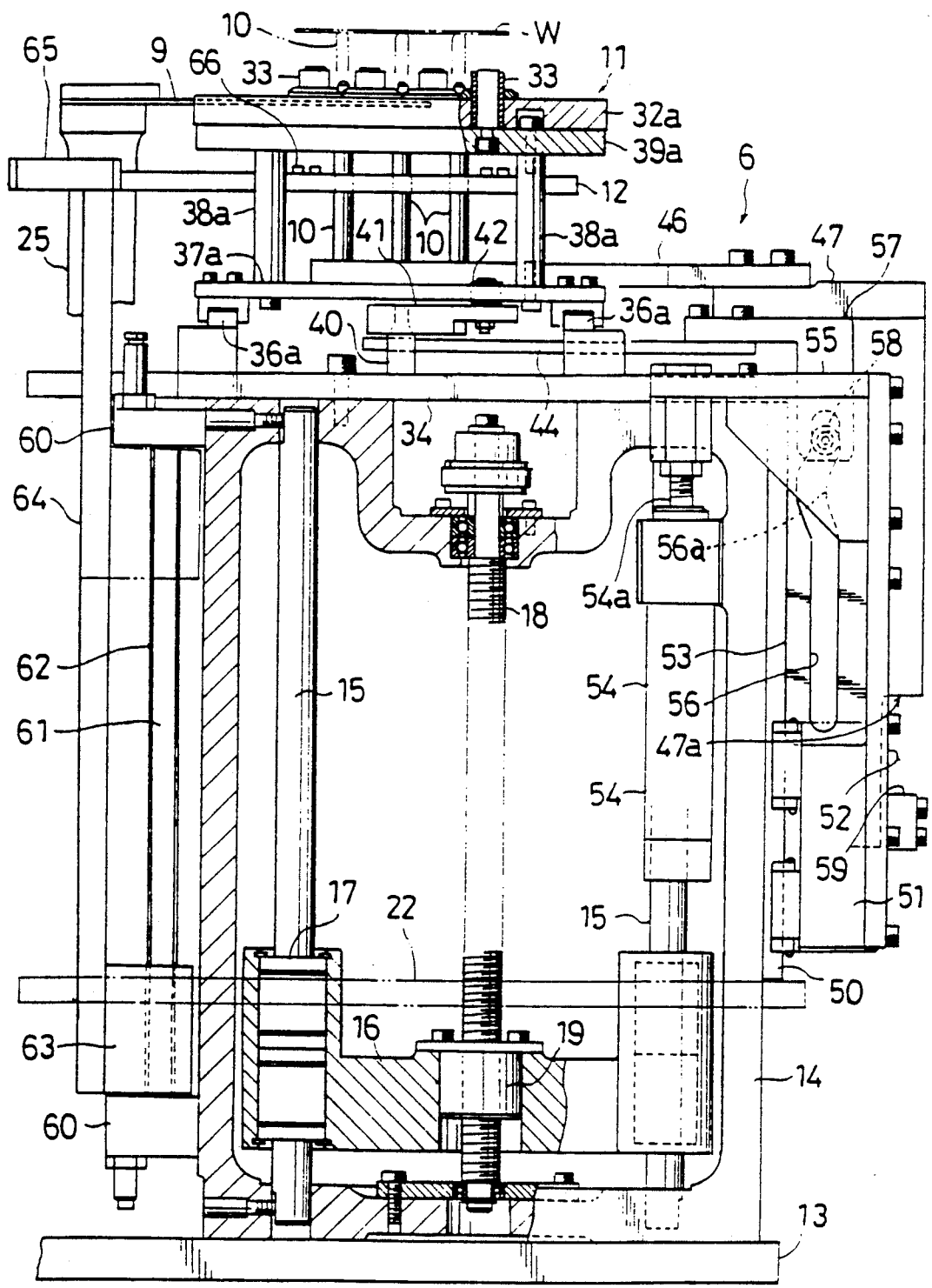
FIG. 4 is a side view of the substrate transfer mechanism.
Figure 6:
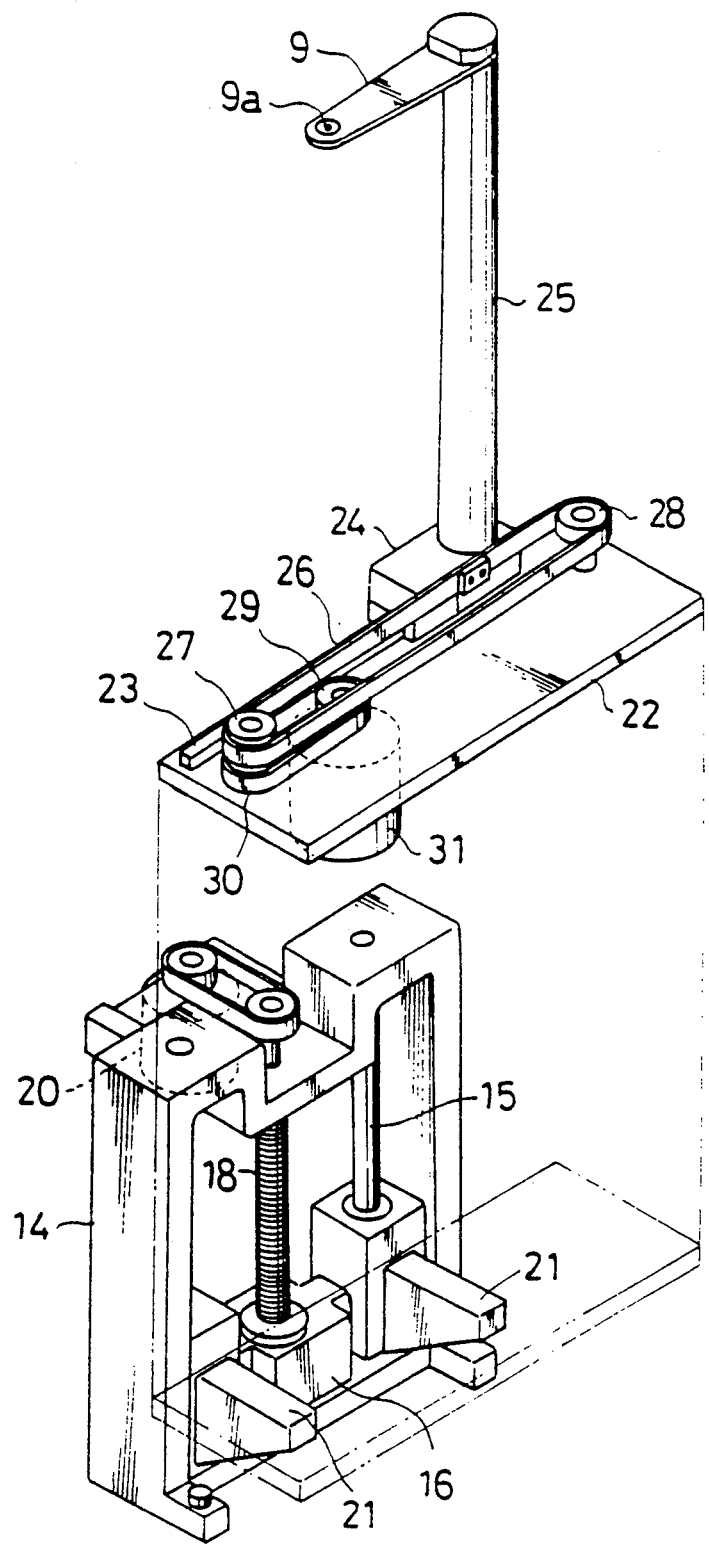
FIG. 6 is a perspective view of a mechanism for depositing substrates in a substrate storage.

As shown in FIG. 4, a hollow stationary frame 14 is erected on a base frame 13. The stationary frame 14 includes a pair of guide shafts 15 extending vertically and slidably supporting a lift block 16 through slide bearings 17. The lift block 16 is meshed through a nut 19 with a screw shaft 18 extending parallel to the guide shafts 15. As shown in FIG. 6, a motor 20 is secured to an upper position of the stationary frame 14 for imparting belt drive to the screw shaft 18 to rotate the latter in opposite directions, whereby the lift block 16 is driven vertically. The lift block 16 includes a pair of brackets 21 for supporting a lift frame 22.

The lift frame 22 includes a guide rail 23 extending transversely of the interface apparatus. An arm base 24 is slidably fitted on this guide rail 23. The arm base 24 has a supporting post 25 erected thereon, which supports the arm 9 extending horizontally in a cantilever fashion from an upper end thereof. The arm 9 includes a suction hole 9a formed in a top surface at a distal end thereof for drawing the wafer W by vacuum suction.

The lift frame 22 carries an endless belt 26 extending between a pair of pulleys 27 and parallel to the guide rail 23. The arm base 24 is connected to a position of the belt 26. Another endless belt 20 is wound around one of the pulleys 27 and a drive pulley 29. The drive pulley 29 is driven by a stepper motor 31 to reciprocate the arm base 24 along the guide rail 23 transversely of the interface apparatus.

Figure 3:
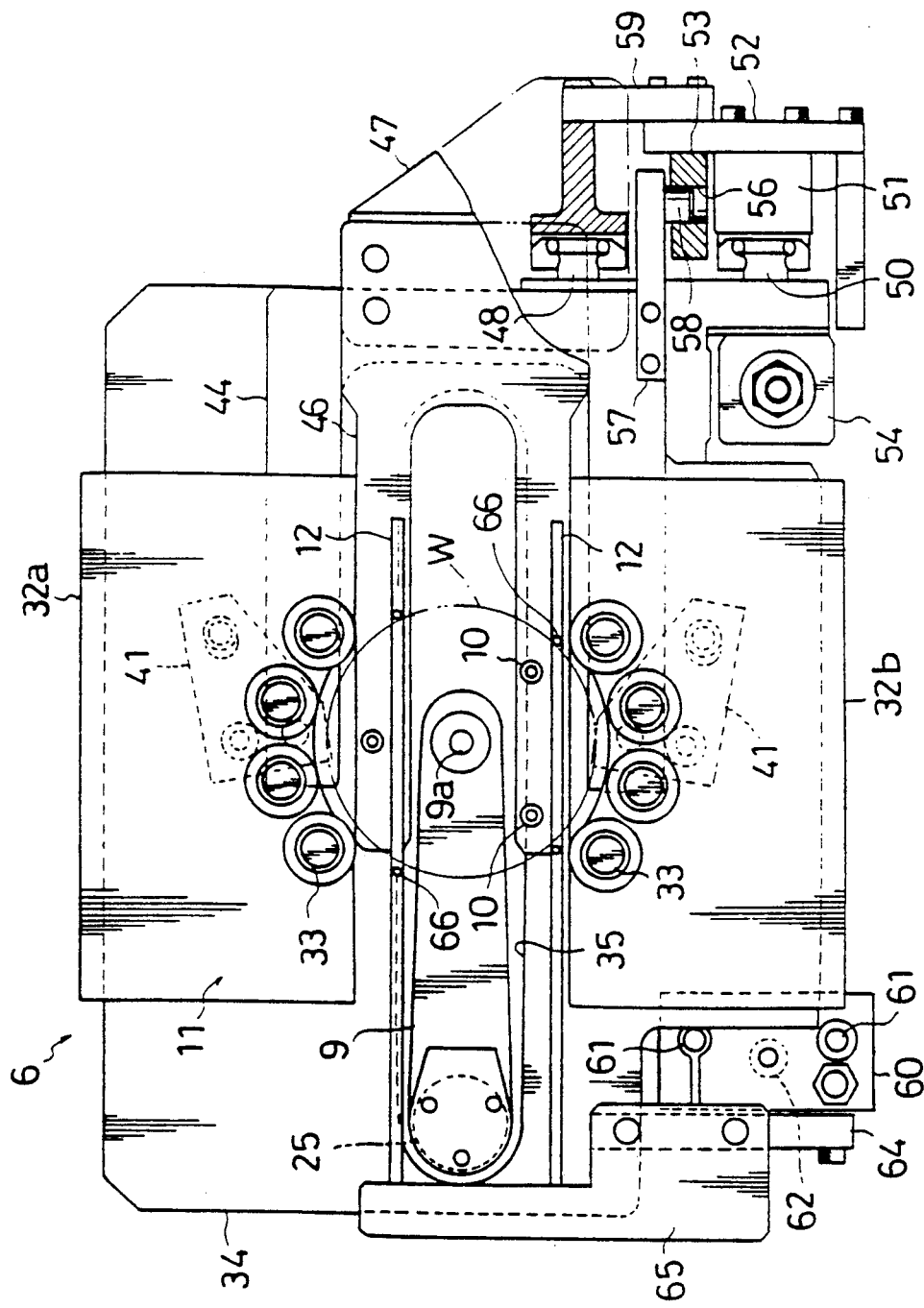
FIG. 3 is a plan view of a substrate transfer mechanism.
Figure 5:
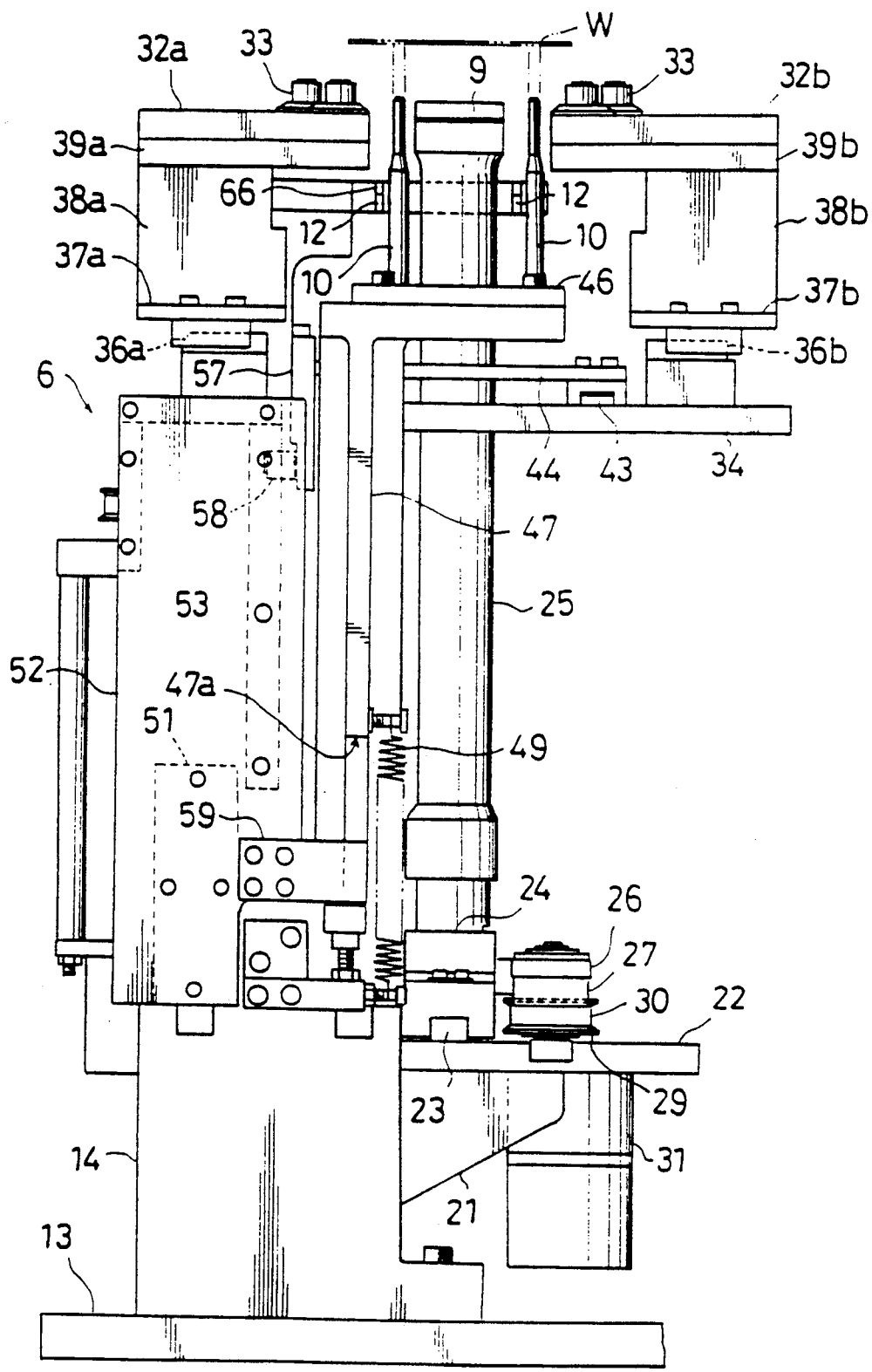
FIG. 5 is a front view of the substrate transfer mechanism.

As shown in FIGS. 3 through 5, the wafer adjusting mechanism 11 includes slidable adjusting plates 32a and 32b opposed to each other across the supporting pins 10. Each of the adjusting plates 32a and 32b (includes a plurality of (four in this embodiment) contact elements 33 projecting upwardly therefrom and arranged in an arc having substantially the same curvature as the wafer W. The adjusting plates 32a and 32b are reciprocable to move the contact elements 33 into and out of contact with outer edges of the wafer W mounted on the supporting pins 10, to adjust position of the wafer W relative to the supporting pins 10.

The stationary frame 14 carries a base plate 34 cantilevered to a top surface thereof for slidably supporting the adjusting plates 32a and 32b. The base plate 34 defines a slot 35 in a center portion thereof for receiving the supporting post 25 of the arm 9 and allowing the supporting post 25 to move transversely of the interface apparatus when depositing or fetching wafers. A pair of right and left guide rails 36a extends perpendicular to the slot 35, and a slide plate 37a is slidably mounted on the guide rails 36a. The slide plate 37a carries vertical walls 38a supporting, at upper ends thereof, one of the adjusting plates 32a through a support plate 39a. A similar pair of guide rails 36b is arranged opposite the guide rails 36a across the slot 35, and a slide plate 37b is slidably mounted on the guide rails 36b. The slide plate 37b carries vertical walls 38b supporting the other adjusting plate 32b through a support plate 39b.

Figure 7:
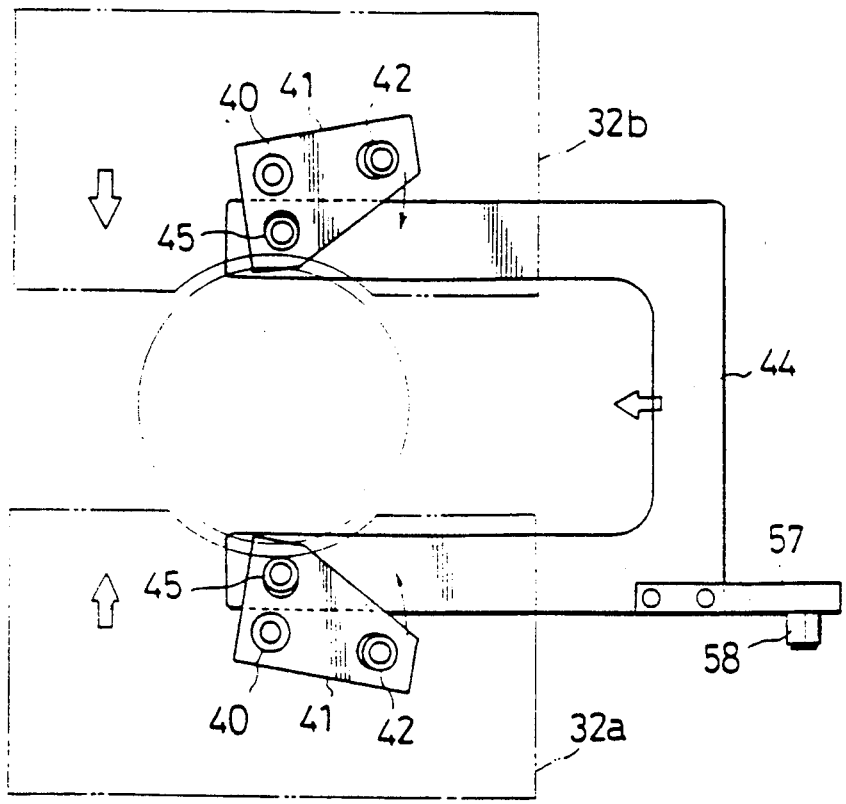
FIGS. 7 and 8 are views illustrating operation of a substrate positioning mechanism.
Figure 8:
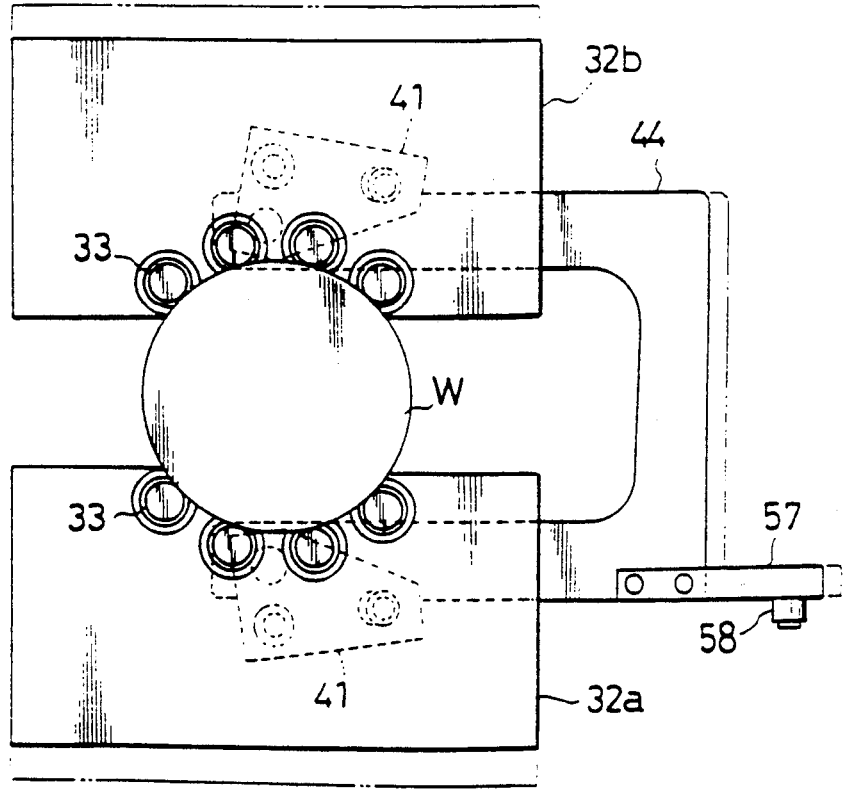

As shown in FIGS. 4 and 7, a link 41 is disposed beneath each of the slide plates 37a and 37b and pivotably connected to the base plate 34 through a pivot axis 40. The link 41 is connected through a connector pin 42 to a slot defined in the associated slide plate 37a or 37b. Further, a U-shaped pusher plate 44 is disposed beneath the links 41 and slidably fitted on guide rails 43 formed on the base plate 34. The pusher plate 44 is connected through connector pins 45 to slots defined in the links 41, respectively. As shown in FIG. 7, when the pusher plate 44 is driven in the direction of an arrow by a cam structure to be described later, its pushing force is transmitted through the connector pins 45 to the links 41. This causes the links 41 to pivot about the pivotal axes 40 in the directions indicated by arrows, respectively. As a result, the adjusting plates 32a and 32b connected to the connector pins 42 of the links 41 move toward each other, whereby the contact elements 33 formed on the adjusting plates 32a and 32b contact outer edges of the wafer W as shown in FIG. 8.

A pin supporting mechanism for vertically movably supporting the supporting pins 10 will be described next.

As shown in FIGS. 3 and 5, the three supporting pins 10 between the adjusting plates 32a and 32b are supported by a U-shaped supporting plate 46. The supporting plate 46 is connected at a proximal end thereof to a lifter 47 slidably fitted on a vertical guide rail 48 attached to the stationary frame 14. As shown in FIG. 5, the lifter 47 is downwardly urged by a coil spring 49 and lies in a lowermost position when the arm 9 is lowered.

The upper ends of the contact elements 33 formed on the adjusting plates 32a and 32b and the upper ends of the supporting pins 10 in the lowermost position are set below the lowermost one of wafers stored in the cassette 7 as shown in FIG. 2. Consequently, the contact elements 33 and supporting pins 10 do not interfere with the arm 9 transporting wafers W into and out of the cassette 7.

A mechanism for driving the contact elements 33 and supporting pins 10 will be described next.

As shown in FIG. 4, a guide rail 50 is formed vertically on one lateral wall of the stationary frame 14, and a movable member 51 is fitted on the guide rail 50. A plate 52 is connected to the movable member 51, and a cam 53 is connected to the plate 52. An air cylinder 54 is secured to the stationary frame 14 adjacent and inside the lateral wall to which the cam 53 is attached. The air cylinder 54 has a rod 54a connected to upper ends of the plate 52 and cam 53 through a connecting piece 55. The cam 53 defines a cam groove 56 including an upper curved portion 56a with working surfaces thereof displaced in a sliding direction of the pusher plate 44, and a lower straight portion continuing downwardly from the curved portion 56a. This cam 53 is engaged with a cam follower 58 attached to a position adjacent a lower end of an L-shaped driven member 57. The other end of the driven member 57 is connected to the pusher plate 44.

As shown in FIG. 4, the plate 52 to which the cam 53 is connected has a pushup element 59 attached to a lower position thereof spaced from a downwardly facing stepped portion 47a of the lifter 47. The pushup element 59 moves into contact with the stepped portion 47a as the cam 53 is driven upward. With further upward movement of the cam 53, the pushup element 59 pushes up the lifter 47 against the force of coil spring 49, thereby raising the supporting pins 10.

As shown in FIGS. 3 and 4, upper and lower brackets 60 are secured on the other lateral wall of the stationary frame 14, and a pair of guide shafts 61 and a rodless cylinder 62 extend vertically between the brackets 60. A movable member 63 is fitted on the guide shafts 61 to be vertical movable by the rodless cylinder 62. The temporary support arms 12 are cantilevered through a connection 65 to an upper end of a support 64 extending upwardly from the movable member 63. The temporary support arms 12 include bosses 66 formed on top surfaces thereof to ensure that the wafer W, even if displaced, would be prevented from falling.

The way in which the interface apparatus as constructed above operates will be described next.

(1) In a normal transfer of wafers W from the processing apparatus 1 to the processing apparatus 2, the wafer transport mechanism 101 of the processing apparatus 1 deposits a wafer W on the supporting pins 10.

(2) Next, the air cylinder 54 extends to move the cam 53 upward. In an initial stage of the upward movement, the cam follower 58 acts on the curved portion 56a of the cam groove 56 to move the pusher plate 44 horizontally. As a result, the adjusting plates 32a and 32b of the wafer adjusting mechanism 11 move toward each other to set the wafer W in position.

(3) With a further upward movement of the cam 53, the adjusting plates 32a and 32b move away from the wafer W.

(4) With a still further upward movement of the plate member 52, the pushup element 59 contacts the stepped portion 47a of the lift member 47. Subsequently, the lifter 47 moves upward with the plate 52, whereby the supporting pins 10 supporting the wafer W set in position moves up to a height for standby.

(5) Thereafter the wafer transport mechanism 10 of the processing apparatus 2 picks up the wafer W from the supporting pins 10.

Assume that, during the wafer transfer operation as described above, a trouble occurs with the processing apparatus 2 and the latter becomes incapable of receiving wafers, particularly when the supporting pins 10 have received a wafer W from the processing apparatus 1 but not transferred it to the processing apparatus 2. In that case, the rodless cylinder 62 is raised for the temporary support arms 12 to receive the wafer W. The temporary support arms 12 are maintained in a standby position higher than the upper limit position of the arm 9 shown in FIG. 2. Then the supporting pins 10 are ready to receive a wafer W from the processing apparatus 1. Subsequently, a wafer W is transferred from the processing apparatus 1 to the supporting pins 10. After the wafer W is positionally adjusted on the supporting pins 10, the movable block 16 is raised to transfer the wafer W from the supporting pins 10 to the arm 9. Then the stepper motor 31 is actuated to move the arm 9 to the wafer storage 8 and deposit the wafer W on an uppermost stage in the cassette 7, for example.

In this way, the wafers W output from the processing apparatus 1 are successively stored in the wafer storage 8 until the trouble is eliminated from the processing apparatus 2. During this operation, the temporary support arms 12 retain the wafer W transferred from the supporting pins 10 to the temporary support arms 12 immediately after the occurrence of the trouble.

The wafers W transported from the processing apparatus 1 to the wafer storage 8 until the trouble is eliminated from the processing apparatus 2 are those wafers which are already in the processing apparatus 1 when the trouble occurs in the processing apparatus 2. That is, upon occurrence of a trouble in the processing apparatus 2, feeding of new wafers W to the processing apparatus 1 is stopped. However, processing of the wafers W already in the processing apparatus 1 is continued, and these wafers W are deposited in the wafer storage 8.

When the trouble has been eliminated from the downstream processing apparatus 2, the temporary support arms 12 are lowered to transfer the wafer W thereby retained to the supporting pins 10 first. The wafer W is positionally adjusted by the wafer adjusting mechanism 11 to rectify any displacement having occurred on the temporary support arms 12, prior to delivery to the processing apparatus 2. Subsequently, the wafers W are reclaimed from the wafer storage 8 and delivered to the processing apparatus 2 in the order in which they were transferred to the wafer transfer mechanism 6.

The foregoing embodiment includes, besides the wafer storage which stores a plurality of wafers, the temporary support arms 12 which can retain a single wafer over the wafer transfer mechanism for the following reason:

In order for the interface apparatus 3 to receive a wafer from the upstream processing apparatus 1, the wafer supported by the wafer transfer mechanism 6 of the interface apparatus 3 must be deposited in the wafer storage 8. Normally, an operation to store a wafer in the wafer storage 8 is time-consuming. If a trouble occurs with the downstream processing apparatus 2 when a wafer is handled by the wafer transfer mechanism 6 of the interface apparatus 3 in the course of transfer from the upstream processing apparatus 1 to the downstream processing apparatus 2, the interface apparatus 3, without temporary support arms as noted above, cannot receive a next wafer from the upstream processing apparatus 1 before the wafer handled by the wafer transfer mechanism 6 is deposited in the wafer storage 8.

In the foregoing embodiment, however, the temporary support arms 12 are operable to pick up the wafer supported on the wafer transfer mechanism 6 and move to the upward standby position promptly upon occurrence of a trouble. This places the interface apparatus 3 in a condition to receive a wafer from the upstream processing apparatus 1. Thus, the upstream processing apparatus 1 is allowed to continue operating and transfer a new wafer to the interface apparatus 3. Subsequent wafers are transferred to the interface apparatus 3 only in the cycles in which the upstream processing apparatus 1 processes the wafers. The interface apparatus 3 receives the wafers with sufficient intervals of time for depositing the wafers in the wafer storage 8. Consequently, even if a trouble occurs with the downstream processing apparatus 2 when a wafer is handled by the wafer transfer mechanism of the interface apparatus 3, this and subsequent wafers may be stored without affecting the upstream processing apparatus 1.

In the foregoing embodiment, the wafer W being transferred is positionally adjusted by the wafer adjusting mechanism 11. However, no positional adjustment is required at the interface apparatus 3 if the upstream processing apparatus 1 is capable of transferring wafers to the wafer transfer mechanism 6 of the interface apparatus 6 with a sufficient degree of positional precision. Further, the wafer adjusting mechanism 11 is operated to effect positional adjustment of the wafer W when the latter is transferred from the temporary support arms 12 to the wafer transfer mechanism 6 within the interface apparatus 3. This is taken as a precaution in the event that the wafer becomes displaced on the temporary support arms 12. Without such possibility, such positional adjustment may be omitted. Thus, the wafer adjusting mechanism 11 in the foregoing embodiment is not absolutely necessary for the purpose of this invention.

In the foregoing embodiment, the processing apparatus 1 is termed as an upstream processing apparatus and the processing apparatus 2 as a downstream ocessing apparatus, with the wafers W transported in one-way traffic from apparatus 1 to apparatus 2. This arrangement may be modified as follows:

A wafer supplying and collecting apparatus is disposed adjacent the processing apparatus 1 for supplying untreated wafers and collecting treated wafers. The untreated wafers supplied from the wafer supplying and collecting apparatus are subjected to a first treatment in the processing apparatus 1, transferred to the processing apparatus 2 through the interface apparatus 3, and subjected to a second treatment in the processing apparatus 2. Thereafter, the treated wafers are returned through the interface apparatus 3 and processing apparatus 1 to the wafer supplying and collecting apparatus. The interface apparatus 3, therefore, transfers half-treated wafers from the processing apparatus 1 to the processing apparatus 2, and completely treated wafers from the processing apparatus 2 to the processing apparatus 1.

In this case, the processing apparatus 1 is an upstream apparatus and the processing apparatus 2 a downstream apparatus as far as the wafers under treatment are concerned. This relationship is reversed for the completely treated wafers.

Various modifications may be made to the components of the foregoing embodiment such as the wafer transfer mechanism, the wafer depositing and fetching mechanism, and the mechanism for driving the temporary support arms. Such components are not limited to the described embodiment.

The present invention may be embodied in other specific forms without departing from the spirit or essential attributes thereof and, accordingly, reference should be made to the appended claims, rather than to the foregoing specification, as indicating the scope of the invention.

What is claimed is:

1. A photoresist processing system for carrying out a series of photoresist processes on substrates, said system comprising:

a first photoresist processing apparatus including a plurality of processing units;

a second photoresist processing apparatus including at least one processing unit;

storage means disposed between said first photoresist processing apparatus and said second photoresist processing apparatus for storing a plurality of substrates in multiple stages;

first transport means for transporting the substrates into and out of said processing units of said first photoresist processing apparatus;

second transport means for transporting the substrates into and out of said processing unit of said second photoresist processing apparatus;

vertically movable third transport means for transporting the substrates into and out of said storage means;

transfer means for transferring the substrates between said first transport means and said second transport means, between said first transport means and said third transport means and between said second transport means and said third transport means; and vertically movable temporary support means operable independently of said first, second and third transport means for raising a substrate from said transfer means and for retaining the substrate above a position to which said third transport means is raised for transporting a substrate into and out of an uppermost stage in said storage means.

2. A photoresist processing system as claimed in claim 1, wherein said transfer means includes at least three supporting pins for supporting a substrate in a horizontal posture, and a pin supporting mechanism for vertically movably supporting said supporting pins, and said photoresist processing system further comprises a substrate adjusting mechanism including a pair of adjusting members opposed to each other across the substrate supported on said supporting pins, said adjusting members being horizontally movable toward and away from each other to contact outer edges of the substrate to effect positional adjustment of the substrate.

3. A photoresist processing system as claimed in claim 2, wherein said pin supporting mechanism and said substrate adjusting mechanism are driven by a single drive mechanism.

4. A photoresist processing system as claimed in claim 1, wherein said storage means includes a cassette for storing said substrates in multiple stages.

5. A photoresist processing system as claimed in claim 1, wherein said vertically movable third transport means includes:

a lift frame supported for vertical movement;
a first motor for driving said lift frame;
an arm base mounted for horizontal sliding movement on said lift frame;
a second motor for driving said arm base; and
a substrate sucking arm cantilevered to an upper portion of a supporting post erected on said arm base.

6. An interface apparatus for transferring substrates between a first processing apparatus having first substrate transport means for successively transporting the substrates into and out of a plurality of processing units, and a second processing apparatus having second substrate transport means for transporting the substrates into and out of at least one of a plurality of processing units, said interface apparatus comprising:

transfer means for transferring the substrates between said first substrate transport means and said second substrate transport means;

storage means for storing a plurality of substrates; and depositing and fetching means for transporting the substrates between said transfer means and said storage means, wherein said transfer means includes at least three supporting pins for supporting a substrate in horizontal posture, and a pin supporting mechanism for vertically movably supporting said supporting pins, and said interface apparatus further comprises a substrate adjusting mechanism including a pair of adjusting members opposed to each other across the substrate supported on said supporting pins, said adjusting members being horizontally movable toward and away from each other to contact outer edges of the substrate to effect positional adjustment of the substrate and wherein said pin supporting mechanism and said substrate adjusting mechanism are driven by a single drive mechanism including:

a single air cylinder having a vertically extendible rod;

a cam connected to said rod to be vertically movable and defining a cam groove having an upper curved portion and a lower straight portion;

a pusher plate horizontally reciprocable with movement of a cam follower engaged in said cam groove;

a pair of links interconnecting said pusher plate and said pair of adjusting members; and a lift member engageable with said cam during upward movement of said cam to move upwardly with said cam and raise said pin supporting mechanism.

7. A photoresist processing system for carrying out a series of photoresist processes on substrates, said system comprising:

a first photoresist processing apparatus including a plurality of processing units;

a second photoresist processing apparatus including at least one processing unit;

storage means disposed between said first photoresist processing apparatus and said second photoresist processing apparatus for storing a plurality of substrates in multiple stages;

first transport means for transporting the substrates into and out of said processing units of said first photoresist processing apparatus;

second transport means for transporting the substrates into and out of said processing unit of said second photoresist processing apparatus;

vertically movable third transport means for transporting the substrates into and out of said storage means;

transfer means for transferring the substrates between said first transport means and said second transport means, between said first transport means and said third transfer means and between said second transport means and said third transfer means; and vertically movable temporary support means operable independently of said first, second, and third transport means for raising a substrate from said transfer means and for retaining the substrate above a position to which said third transport means is raised for transporting a substrate into and out of an uppermost stage in said storage means;

wherein said temporary support means is movable upward for raising and retaining the substrate from said transfer means when a downstream one of said first and second photoresist processing apparatus becomes incapable of receiving substrates;

wherein said third transport means is operable, after said temporary support means raises and retains the substrate, for receiving substrates from an upstream one of said first and second photoresist processing apparatus through said transfer means, and for transporting the substrates into said storage means;

said temporary support means being movable downward, when the downstream photoresist processing apparatus becomes capable of receiving substrates, for transporting the substrate retained by said temporary support means to the downstream photoresist processing apparatus through said transfer means; and said third transport means is operable, after said temporary support means releases the substrate retained thereby, for fetching the substrates from said storage means and transporting the substrates to the downstream photoresist processing apparatus through said transfer means.

* * * * *